(12) United States Patent
Holztrattner et al.

(10) Patent No.: US 12,092,683 B2
(45) Date of Patent: Sep. 17, 2024

(54) SAFETY DEVICE FOR WORK ON ELECTRICAL SYSTEMS

(71) Applicant: Adaptive Regelsysteme Gesellschaft m.b.H., Salzburg (AT)

(72) Inventors: Dietmar Holztrattner, Scheffau am Tennengebirge (AT); Michael Altenbuchner, Salzburg (AT)

(73) Assignee: Adaptive Regelsysteme Gesellschaft m.b.H., Salzburg (AT)

( * ) Notice: Subject to any disclaimer, the term of this patent is extended or adjusted under 35 U.S.C. 154(b) by 191 days.

(21) Appl. No.: 17/910,792

(22) PCT Filed: Mar. 10, 2021

(86) PCT No.: PCT/EP2021/055966
§ 371 (c)(1),
(2) Date: Sep. 9, 2022

(87) PCT Pub. No.: WO2021/180750
PCT Pub. Date: Sep. 16, 2021

(65) Prior Publication Data
US 2023/0114738 A1  Apr. 13, 2023

(30) Foreign Application Priority Data
Mar. 12, 2020 (AT) .............. A 50210/2020

(51) Int. Cl.
*G01R 31/28* (2006.01)
*A41D 13/008* (2006.01)
(Continued)

(52) U.S. Cl.
CPC ....... *G01R 31/2827* (2013.01); *A41D 13/008* (2013.01); *G08B 21/02* (2013.01); *H02H 3/16* (2013.01); *H02H 5/12* (2013.01)

(58) Field of Classification Search
CPC ........ G08B 21/02; G08B 21/00; G01R 31/28; G01R 31/2827; A41D 13/008; H02H 5/12; H02H 3/16
(Continued)

(56) References Cited

U.S. PATENT DOCUMENTS 4,175,255 A    11/1979  Linnman et al.
4,983,954 A *  1/1991   Huston ................ G08B 21/182
                                                  340/657
(Continued)

FOREIGN PATENT DOCUMENTS

DE    2709815 A1    9/1978
DE    3903025 A1    8/1990
(Continued)

*Primary Examiner* — Danny Nguyen
(74) *Attorney, Agent, or Firm* — Dykema Gossett PLLC

(57) ABSTRACT

The aim of the invention is to prevent undesired false triggering of a safety device, which protects a person from electric shock as a result of unintentional contact with voltage-carrying or current-carrying parts. This aim is achieved in that a triggering sensitivity ($E_A$) of the safety device is changed depending on a determined body resistance ($R_K$) of the person wearing the safety device.

6 Claims, 3 Drawing Sheets

(51) Int. Cl.
  *G08B 21/02* (2006.01)
  *H02H 3/16* (2006.01)
  *H02H 5/12* (2006.01)

(58) Field of Classification Search
  USPC .................................... 361/212, 220, 231
  See application file for complete search history.

(56) References Cited

U.S. PATENT DOCUMENTS

2005/0101875 A1    5/2005  Semler et al.
2005/0264427 A1*  12/2005  Zeng ...................... H02H 5/12
                                                              340/635

FOREIGN PATENT DOCUMENTS

| DE | 4438063 A1 | 5/1995 |
|---|---|---|
| EP | 3588717 A2 | 1/2020 |
| WO | 2019243379 A1 | 12/2019 |
| WO | 2019243388 A1 | 12/2019 |

* cited by examiner

SAFETY DEVICE FOR WORK ON ELECTRICAL SYSTEMS

CROSS-REFERENCE TO RELATED APPLICATIONS

This application is a national stage filing based upon International PCT Application No. PCT/EP2021/055966, filed 10 Mar. 2021, which claims the benefit of priority to Austria application No. A 50210/2020, filed 12 Mar. 2020.

BACKGROUND

The present invention relates to a safety device comprising at least two skin electrodes, in which a first measuring device and a measurement signal evaluation unit are provided, wherein the first measuring device detects a first electrical measurement signal in a measurement frequency range between the at least two skin electrodes and the measurement signal evaluation unit determines an evaluation signal from the detected first measurement signal and triggers the safety device if the evaluation signal reaches a specified triggering sensitivity of the safety device, and an energy source is provided that feeds an electrical feed signal having a specified feed frequency unequal to the measurement frequency range via the at least two skin electrodes, wherein a second measuring device and a resistance evaluation unit are provided, and the second measuring device detects a second electrical measurement signal at the feed frequency, and the resistance evaluation unit determines a body resistance occurring between the at least two skin electrodes from the detected second measurement signal and the feed signal. The invention also relates to a method for operating such a safety device.

It is common in electrical systems, in particular in an industrial environment, to provide an emergency stop in order to disconnect a voltage-carrying or current-carrying component that is part of the emergency stop circuit from the power supply using an emergency stop if a person touches said component. With such safety devices, the protection against electric shock as a result of unintentional contact of people working on voltage-carrying parts or current-carrying parts can be increased by other people present triggering the emergency stop in the event of a fault. As a rule, the person involved in the accident cannot activate the emergency stop itself. However, this requires that at least one further person is in the vicinity of an electrical accident and has knowledge of the electrical accident, which is not always the case.

Other common safety devices in electrical systems are automatic circuit breakers for disconnecting circuits from the power supply in the event of an unacceptable electrical current and ground fault circuit breakers that are intended to respond in the event of unacceptable ground fault currents. However, these, if available, can only provide protection if they actually respond in the event of an error. Due to possible high response currents or slow reaction times, there may be a danger for people working on the system despite such safety devices.

Methods and devices for a better protection of persons from unacceptable electrical body currents are therefore already known. DE 39 03 025 A1, for example, describes such a method and such a device, wherein an electrode connected to a control device is arranged on at least two extremities of the person, for example on the arms or legs. The control device detects a body current caused by a contact with an electrical external potential via the electrodes. If such a current flow is detected, the control device activates a switch-off device with which the further supply of current to the contact point is interrupted. The electrodes and the control device can be arranged on an item of clothing, and the connection between the control device and the switch-off device can be wireless. DE 44 38 063 A1 describes a similar safety device.

With such safety devices, the protection against electric shock as a result of unintentional contact of people working on voltage-carrying parts or current-carrying parts can be increased. Of course, safety is linked to the correct functioning of such safety clothing. However, work clothing is subject to high loads when worn and is often treated or worn with little care by the wearer. This can be particularly problematic with electrodes that need to be in contact with the wearer's skin to ensure proper function. This assumes that the electrodes are correctly applied, or if they are integrated into the garment, that the garment is correctly applied. However, the improper application of electrodes at least impairs the functioning of the safety devices, which may not be noticed by the person wearing them. Likewise, there is a problem that the contact resistance between the electrode and the skin may also change, which can likewise impair the measurement of a body current and the protective function. Under certain circumstances, this can be even more dangerous for the person wearing the safety device than no safety devices at all, if they, in the belief that they are protected, are very careless under some circumstances while working.

It is therefore already known from DE 27 09 815 A1 in connection with such a safety device to measure the resistance between two electrodes for contact with the skin of the person wearing them at certain time intervals. If the resistance exceeds a certain value, for example if an electrode loses contact with the skin or the contact resistance between the electrode and the skin becomes too great, the voltage between the electrodes increases and triggers the safety device, disconnecting the electrical system from the power supply. The disadvantage of this design is that if contact is lost or the contact of an electrode with the skin degrades, the safety device is triggered immediately, even though there may be no danger at all for the wearer of the safety device, in particular if there has been no electrical accident. The contact can be interrupted or degraded, for example, if the wearer scratches in the region of the electrode, or if an electrode slips, or if the contact resistance changes as a result of certain circumstances (e.g., dry skin). In an embodiment of a safety device according to DE 27 09 815 A1, undesired fault triggering can thus occur, resulting in the safety device being triggered and thus an electrical interruption in the system. If, on the other hand, the contact resistance at an electrode increases, for example as a result of poor contact, e.g., because the electrode slips, and the person is in an electrical field (e.g., in the region of a high-voltage system), a greater voltage potential can also be generated by the electrical field on one electrode than on the other electrode. The voltage thus generated between the electrodes can also trigger the safety device, even though no electrical accident has occurred. Although the safety for a person is of course high, it can often lead to undesired false triggering and associated electrical interruptions in the electrical system in which the person is working. However, such unjustified interruptions as a result of false triggering are often highly undesirable and should be avoided.

It is therefore an object of the present invention to specify a safety device which protects a person from electric shock as a result of unintentional contact with voltage-carrying or current-carrying parts, in which undesired false triggering of the safety device is prevented as much as possible.

SUMMARY OF THE INVENTION

According to the invention, this object is achieved by the safety device changing the triggering sensitivity depending on the determined body resistance. In this way, it can be achieved that the safety device is only triggered when an impermissible body current is detected while the skin electrodes are properly applied and in contact. False triggering as a result of skin electrodes not being properly applied or not being properly attached can thus be avoided as much as possible.

Further advantageous embodiments and effects of the invention can be found in the dependent claims and the following description.

BRIEF DESCRIPTION OF THE DRAWINGS

The present invention will be explained in greater detail in the following with reference to FIGS. 1 to 5, which show exemplary advantageous embodiments of the invention in a schematic and non-limiting manner. In the drawings.

DETAILED DESCRIPTION

Figure 1:
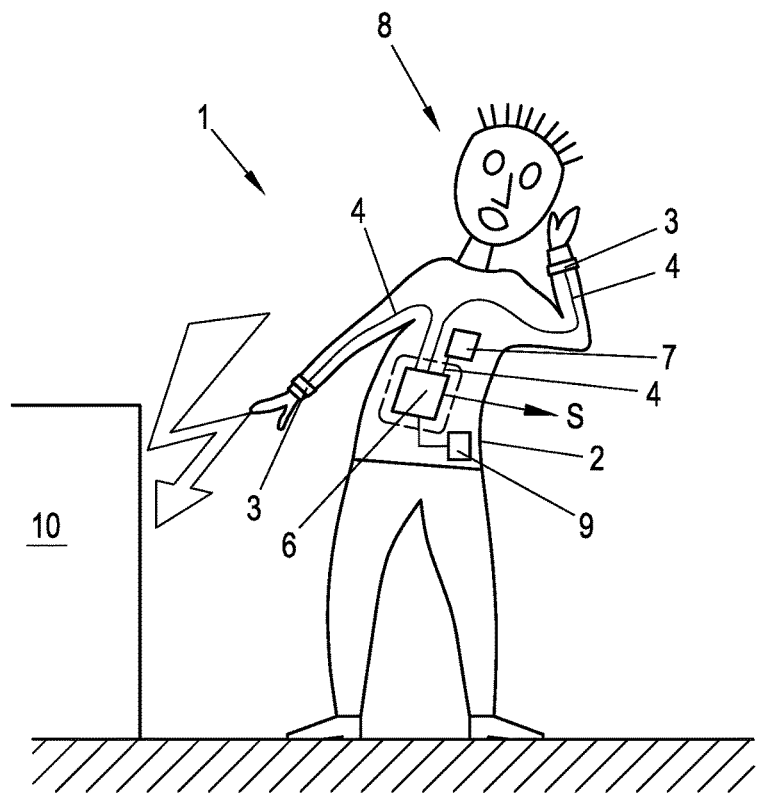
FIG. 1 shows a safety device used for the invention.
Figure 2:
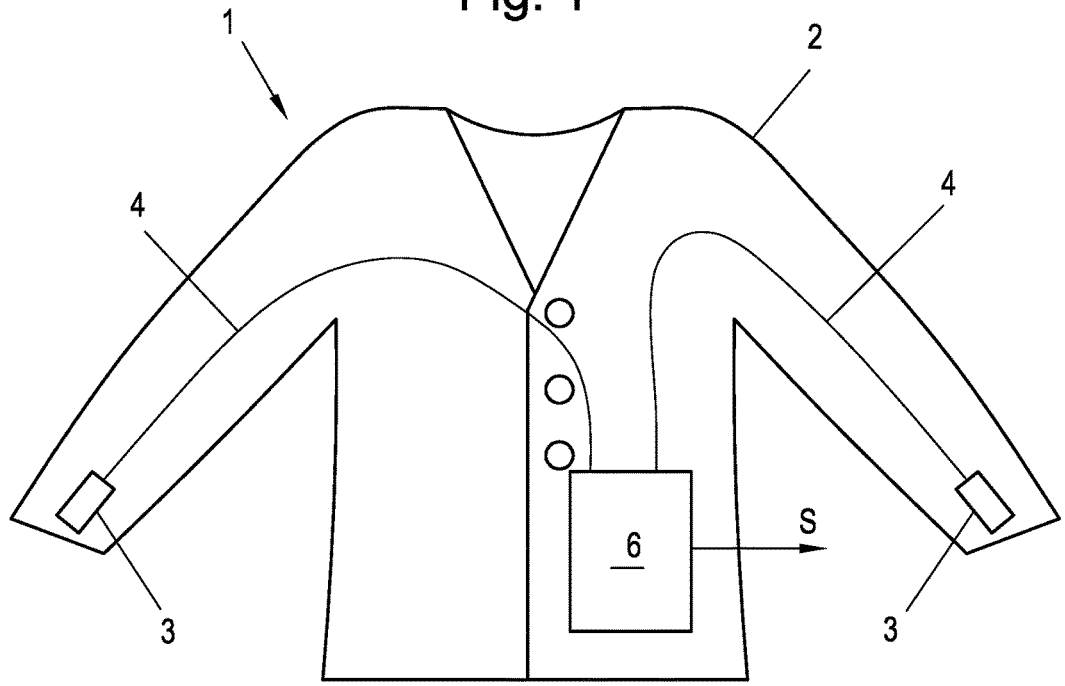
FIG. 2 shows a safety device having two skin electrodes on an item of clothing.

The present invention uses a safety device 1, the basic function of which is known from prior art and which is explained in more detail with reference to FIGS. 1 and 2 for a better understanding. The safety device 1 is used to increase the safety of a person 8 working in the vicinity of an electrical system 10, in particular with regard to electrical accidents of the person 8 as a result of unintentional contact with a voltage-carrying or current-carrying part of the electrical system 10. The safety device 1, or at least parts thereof, is preferably arranged on or integrated into an item of clothing 2. In particular outerwear, for example a shirt, trousers, a sweater, a T-shirt, a jacket, overalls, etc., are considered an item of clothing 2. Even combinations of a plurality of items of clothing 2 are also possible, for example a combination of trousers and shirt, etc. At least two skin electrodes 3 are arranged on the item of clothing 2 in order to detect an electrical body current flowing through the human body of the person 8 wearing said clothing. For example, an electrical potential is detected with a skin electrode 3 in order to thereby detect an electrical current or an electrical voltage between two skin electrodes 3 that are at different electrical potentials. The skin electrodes 3 are preferably arranged at exposed locations on the item of clothing 2, for example in the region of the extremities of the person 8, i.e., for example on sleeves, trouser legs or hoods. Additional sensors, such as a biometric sensor 7 for detecting a biometric signal, for example the frequency of a person's heartbeat, the amplitude or the course of the heartbeat, the respiratory rate, the skin resistance, etc., can also be provided on the safety device 1. By evaluating the biometric signal, in particular the heartbeat (frequency, amplitude and/or course), a flowing electrical body current can also be inferred, or the state of health of the person 8 wearing said device can be inferred.

The skin electrodes 3, and optionally also further sensors 7, are preferably integrated in the item of clothing 2, but can also be applied separately from the item of clothing 2, for example by means of a sleeve, a bracelet or a belt.

The at least two skin electrodes 3 are each connected to an evaluation unit 6 via at least one signal line 4. A further sensor 7 (if present) can also be connected to the evaluation unit 6 by means of a signal line. The measurement signals detected with the skin electrodes 3 and possible additional sensors are evaluated in the evaluation unit 6. An electrical potential detected with a skin electrode 3 or a detected flowing electrical current can be evaluated, for example. An applied electrical voltage can be determined between two electrical potentials detected, for example with two skin electrodes 3, and evaluated in the evaluation unit 6. The evaluation can likewise be carried out in an analog manner with suitable electrical circuits or digitally, which requires an A/D conversion and corresponding hardware and software. In the event of a dangerous body current being identified, for example in the case of an abnormal heartbeat, a detected dangerous body current or a dangerous potential difference (voltage) between two skin electrodes 3, which in turn leads to an electrical body current through the body, the evaluation unit 6 can trigger the safety device 1. When triggered, the safety device 1 can generate an emergency signal S, for example, which can be used to trigger a desired action. In principle, the emergency signal S can be output with a cable or wirelessly. For this purpose, corresponding limit values for an acceptable body current, for example for an acceptable electrical potential difference or an acceptable electrical current, can of course also be stored or specified in the evaluation unit 6, which can also be adjustable. Likewise, samples of a biometric signal that indicate a dangerous body current can also be stored in the evaluation unit 6. However, the safety device 1 can also indicate, for example via the evaluation unit 6, a dangerous body current when it is triggered, for example acoustically, visually or palpably.

The evaluation unit 6 can be designed in the form of a microprocessor-based computing unit, where applicable also with appropriate software, an application-specific integrated circuit (ASIC) or a field programmable gate array (FPGA) or the like. However, the evaluation unit 6 can also be designed as an analog electrical circuit. Mixed forms are conceivable as well. The evaluation unit 6 can also be divided into a plurality of such units.

The safety device 1 can be used in an electrical system 10 in the region of which the person 8 is active, in order to set certain configured actions when the safety device 1 is triggered, in order to increase the protection of a person 8 from electric shock. A simple indication of dangerous body currents, as well as switching actions in the electrical system 10 in order to disconnect the electrical system 10 or parts thereof from the power supply can be considered as actions. Switching operations can be triggered, for example, by the emergency signal S transmitted by the safety device 1.

The electrical system 10, or a part thereof, can, of course, be disconnected from the power supply in various ways. For example, a switch could be activated in order to separate a circuit from the mains supply, wherein the switch can also be an emergency stop switch that is present in the electrical system 10. Likewise, a circuit could be short-circuited (for example, by connecting a phase to the neutral conductor) in order to trigger a circuit breaker to thereby disconnect the circuit from the network. A sufficiently high ground fault current could also be generated (for example, by connecting a phase to the ground with a resistor) to trigger a ground fault current circuit breaker. In addition, there are, of course, also other options for disconnecting the electrical system 10 or parts thereof from the power supply.

Advantageously, different sensors can be provided on the item of clothing 2 in order to increase the reliability of the detection of dangerous electrical body currents. For example, at least two skin electrodes 3 could be provided on extremities and additionally a biometric sensor 7 for detecting the heartbeat, as shown in FIG. 1.

The safety of the safety device 1 can also be increased by providing redundancies. For example, more than one signal line 4 can be provided per sensor or per skin electrode 3, so that possible cable breaks or contact errors do not have to lead to a failure of the safety function, or a cable break or contact error can even be recognized and possibly also displayed.

The evaluation unit 6 is preferably held or carried by the person 8 wearing the safety device 1. This evaluation unit could be arranged, for example, in a shoulder bag or a backpack, but could also be plugged into a pocket of the item of clothing 2 or could also advantageously be integrated, wholly or partially, in the item of clothing 2, for example in the form of an intelligent item of clothing with integrated electronics (as indicated in FIG. 2).

The safety device 1 according to the invention has at least two skin electrodes 3, which must be in electrically conductive contact with the skin of the person 8 wearing it in order to function properly. Both skin electrodes 3 are each connected to the evaluation unit 6 via at least one signal line 4, so that an applied electrical voltage or an electrical current can be measured between the two skin electrodes 3 in the evaluation unit 6. Of course, it does not matter where the two skin electrodes 3 are arranged on the human body, but extremities are particularly suitable for an arrangement, for example on both arms or on one arm and one leg. In particular, more than two skin electrodes 3 can also be provided.

The skin electrodes 3 are preferably integrated into an item of clothing 2 (e.g., again in the form of an intelligent item of clothing), but can also be applied separately, for example by means of a sleeve, a bracelet or a belt.

Figure 3:
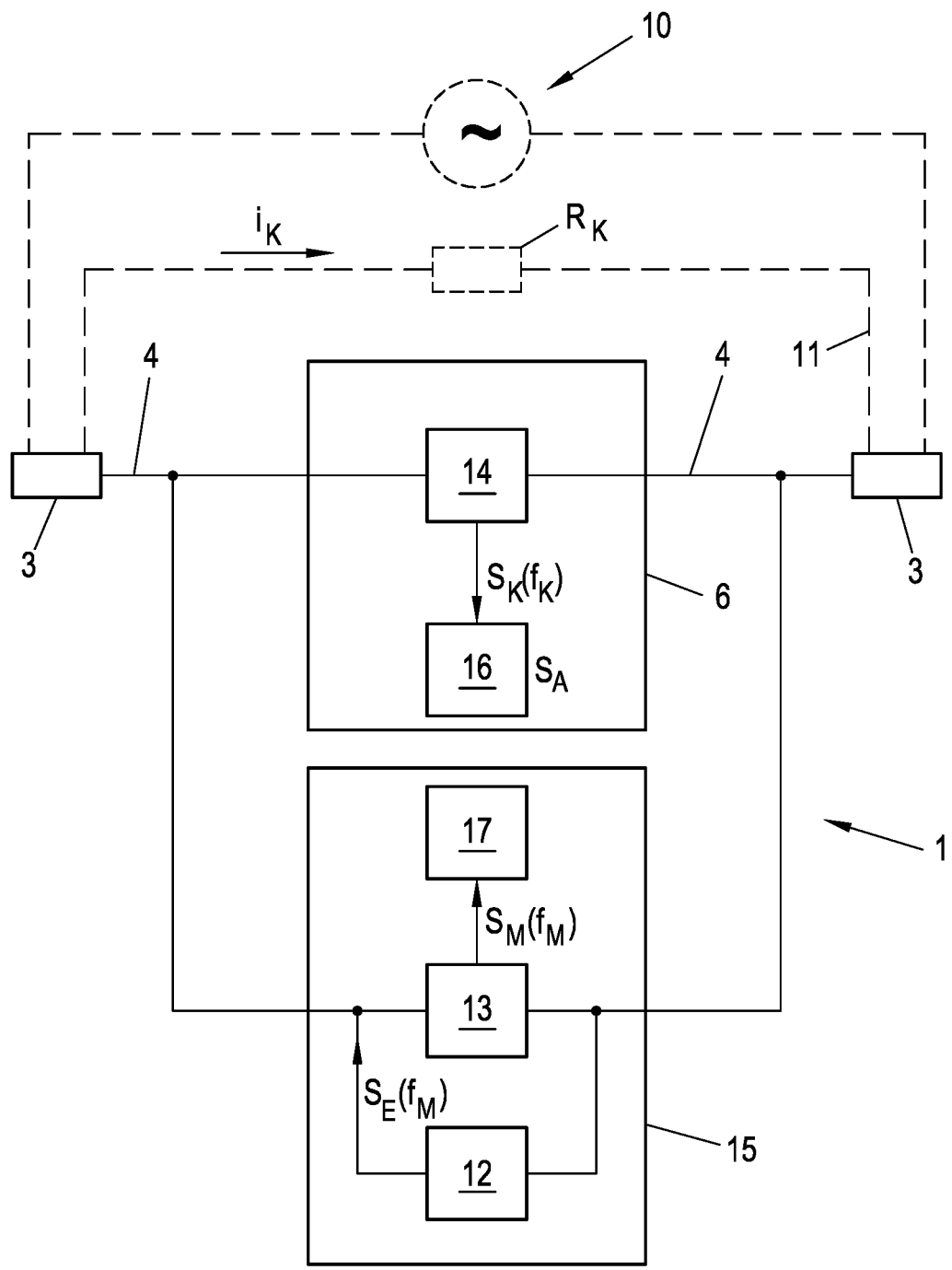
FIG. 3 shows an arrangement for measuring a body resistance via the skin electrodes.

The body of the person 8 closes an electrical circuit 11 between at least two skin electrodes 3, as indicated by dashed lines in FIG. 3. In order to detect a dangerous electrical body current $i_K$ flowing between the at least two skin electrodes 3, a measuring unit 14 is provided in the evaluation unit 6 which is connected to the at least two skin electrodes 3. The electrical body current $i_K$ is caused, for example, by contacting a voltage-carrying or current-carrying part of the electrical system 10 (as indicated in FIG. 3 as a voltage source by dashed lines). A first electrical measurement signal $S_K(f_K)$ is detected in a specified measurement frequency range $f_K$ with the measuring unit 14. The measurement signal $S_K(f_K)$ is evaluated in a measurement signal evaluation unit 16 (hardware such as a microprocessor, ASIC, FPGA or the like, or software) of the evaluation unit 6 in order to obtain an evaluation signal $S_A$. However, the measuring unit 14 and the evaluation unit 6 could also be designed separately from one another. The measuring unit 14 would then make the measurement signal SK available to the evaluation unit 6 in a suitable manner. The measurement signal evaluation unit 16 is preferably implemented as software on the evaluation unit 6.

The measurement frequency range $f_K$ is preferably a frequency range in which electrical signals in the electrical system 10 are expected. For logical reasons, the measurement frequency range $f_K$ thus includes a mains frequency of the electrical system 10, for example 50 Hz or 60 Hz. In certain fields of application, in an electrical railway network for example, however, other frequencies, for example 16.7 Hz, also occur. In order for the safety device 1 to be flexibly usable, an entire measurement frequency range $f_K$ is preferably monitored, for example frequencies less than 100 Hz, wherein it is also possible for a frequency $f_K=0$ Hz to be included (i.e., zero frequency quantities). It should also be noted that the measurement frequency range $f_K$ can also include only a single selected frequency, for example a mains frequency of a supply network, for example 50 Hz. The measurement frequency range $f_K$ can be set by suitable filtering of the first measurement signal $S_K$.

The evaluation signal $S_A$ in turn depends on the way in which the measurement signal $S_K$ is evaluated. In principle, the measurement signal $S_K$ can be processed in the time domain or frequency domain, or both. The evaluation could also include the filtering of the first measurement signal $S_K$ to the specified measurement frequency range $f_K$. In the time domain, for example, the maximum value of the measurement signal $S_K$ in the measurement frequency range $f_K$ could be determined in a specific time period (for example a period of an alternating quantity with specific frequency) in order to determine the maximum value as the evaluation signal $S_A$. However, the electrical energy or power of the measurement signal $S_K$ could also be determined. The evaluation signal $S_A$ would then be electrical energy or power. For an evaluation in the frequency domain, the measurement signal $S_K$ could be subjected to a Fourier transform (e.g., FFT), and then the different frequencies or frequency bands could be evaluated. For example, a maximum value determination could take place again.

The evaluation unit 6 has a specified assigned triggering sensitivity $E_A$ for the evaluation signal $S_A$, which sensitivity defines when the safety device 1 triggers depending the evaluation signal $S_A$, for example when the evaluation signal $S_A$ exceeds the triggering sensitivity $E_A$ (also in the sense of falling below it). The triggering sensitivity $E_A$ is of course linked to the evaluation signal $S_A$ and the way in which the measurement signal $S_K$ is evaluated. If the safety device 1 is triggered, for example when an impermissible electrical body current $i_K$ is detected, an emergency signal S is output and/or a warning signal is generated and displayed to the person (acoustically, visually, palpably) and/or another configured action is triggered, preferably in the electrical system 10.

In one exemplary embodiment, an electrical voltage at mains frequency is detected (in the time or frequency domain) as the measurement signal $S_K$. The maximum voltage in a mains period (i.e., the amplitude of the alternating quantity), which can be equated with a body current $i_K$ that is flowing, is detected as the evaluation signal $S_A$. A limit voltage is specified as triggering sensitivity $E_A$. If the maximum voltage detected exceeds the limit voltage, the safety device 1 is triggered. Alternatively, an electrical current could also be detected at mains frequency and compared to a limit current as triggering sensitivity $E_A$.

In order to check whether the skin electrodes 3 are in proper contact with the skin, it is provided that the body resistance $R_K$ (also in the sense of a body impedance) of the person 8 is measured between the two skin electrodes 3, as explained with reference to FIG. 3. The circuit 11 can be used to determine the body resistance $R_K$ when an electrical voltage is applied to the skin electrodes 3 and the current flow is measured. Likewise, of course, an electrical current can be applied via the skin electrodes 3 and the electrical voltage between the two skin electrodes 3 can be measured.

Electrical alternating quantities are preferably used to measure the body resistance $R_K$ between the two skin electrodes 3. However, zero frequency quantities (such as direct voltage and direct current) can also be used. In general, an electrical feed signal $S_E(f_M)$ (electrical voltage or electrical current) with a feed frequency $f_M$ is used to determine the body resistance $R_K$. A measuring device 13 detects a measurement signal $S_M(f_M)$ (electrical current or electrical voltage) at this feed frequency $f_M$, and the body resistance $R_K$ (which can also be an impedance) is determined from the feed signal $S_E(f_M)$ and the measurement signal $S_M(f_M)$, usually as a quotient of the two signals. The feed frequency $f_M$ is a suitable frequency, wherein alternating quantities with $f_M>0$ Hz and also zero frequency quantities, i.e., $f_M=0$ Hz, are included. In principle, it could also be fed in a frequency range, i.e., a plurality of frequencies. Then the body resistance $R_K$ could also be determined at different frequencies, which could then also be averaged.

For example, a resistance measuring device 15 is provided in the safety device 1 with an electrical energy source 12 (a voltage source or a current source, typically a voltage-limited current source) for feeding an electrical feed signal $S_E(f_M)$ with the specified feed frequency $f_M$, for example an electrical voltage and/or an electrical current, into the resulting circuit 11. A measuring unit 13 (a current measuring unit or a voltage measuring unit) of the safety device 1 detects a measurement signal $S_M(f_M)$ at the feed frequency $f_M$, for example an electrical current or electrical voltage caused by the feed signal $S_E(f_M)$. The energy source 12 is connected in parallel to the measuring unit 13 for feeding in, for example. Feeding in the feed signal $S_E(f_M)$ to determine the body resistance $R_K$ can take place continuously or at certain time intervals. The body resistance $R_K$ (also as impedance) can then be determined at the feed frequency $f_M$ in a resistance evaluation unit 17 from the feed signal $S_E(f_M)$ and the measurement signal $S_M(f_M)$, for example simply from Ohm's law (under the simplified assumption of a purely ohmic resistance).

The resistance measuring device 1 is preferably arranged in parallel with the evaluation unit 6 as in FIG. 3, but could also be connected in series therewith.

The resistance measuring device 15, or parts thereof such as the resistance evaluation unit 17, can also be integrated in the evaluation unit 6, for example as software or as a separate FPGA, ASIC, microprocessor, electrical circuit or the like. The resistance measuring device 15 is preferably integrated into the item of clothing 2 (for example again in the form of an intelligent item of clothing).

The feed signal $S_E(f_M)$ (voltage or current) is fed in at a specific predetermined feed frequency $f_M$, which differs from the measurement frequency range $f_K$ of the safety device 1.

If a feed frequency $f_M$ is used that is not equal to the measurement frequency range $f_K$, the body resistance $R_K$ can be determined simultaneously with the monitoring function of the safety device 1. If, for example, the range of frequencies less than 100 Hz is selected as the measurement frequency range $f_K$, the feed frequency $f_M$ for measuring the body resistance $R_K$ could be in the kHz range, for example 1 kHz. This enables a reliable separation of the monitoring function and the resistance measurement.

A very small electrical signal is preferably selected as the feed signal $S_E(f_M)$, which electrical signal only needs to be large enough for reliable, frequency-selective detection in the measuring unit 13 to be possible. Typically, an electrical voltage in the range of a few millivolts or an electrical current in the microampere range is fed in as the feed signal $S_E(f_M)$.

In a preferred embodiment, an electrical current having the intended feed frequency $f_M$ is fed into the circuit 11 via the at least two skin electrodes 3 with the energy source 12 as a feed signal $S_E(f_M)$, and the electrical voltage occurring through the body resistance $R_K$ is measured by the measuring unit 13 as a measurement signal $S_M(f_M)$. From this, the body resistance $R_K$ is determined at this feed frequency $f_M$.

The measuring unit 13 of the resistance measuring device 15 and the measuring unit 14 for monitoring the body current $i_K$ could also be combined in a single measuring unit. For this purpose, filters could be provided in a common measuring unit in order to divide the electrical signal detected with the measuring unit, for example an electrical voltage or an electrical current, in a frequency-selective manner into the measurement signal $S_K(f_K)$ in the measurement frequency range $f_K$ and the measurement signal $S_M(f_M)$ at the feed frequency $f_M$.

Likewise, both the measurement signal evaluation unit 16 and the resistance evaluation unit 17 could be implemented in a common unit, for example as software on a microprocessor of the evaluation unit 6.

A limit resistance $R_G$ (also in the sense of a limit impedance) can be defined in the safety device 1, from which one can assume improper contacting between a skin electrode 3 and the skin of the person 8 wearing said device. The limit resistance $R_G$ can, for example, be stored in the evaluation unit 6 or the resistance measuring device 15 and could also be changeable.

If the determination of the body resistance $R_K$ does not establish proper contact between the skin electrodes 3 and the skin of the person 8 (e.g., by comparison to a limit resistance $R_G$), the safety device 1 can emit a warning signal W, for example an acoustic, visual or palpable signal, to inform the person 8 wearing said device that the safety device 1 is not functioning properly. Alternatively or additionally, when an impermissible body resistance $R_K$ is detected, the emergency signal S can also be generated and output, or another configured action can be taken.

It is obvious from the function of the safety device 1 described above that a missing or poor contact of a skin electrode 3 with the skin of the person 8 wearing said device can be detected via the determined body resistance $R_K$. The safety device 1 can indicate this state in a suitable manner, but for safety reasons it cannot stop the detection of a dangerous body current $i_K$ as a result of the person 8 unintentionally contacting an external potential in the electrical system 10. It could be that a skin electrode 3 slips only briefly due to a movement of the person 8 and the contact resistance between the skin electrode 3 and the skin increases as a result, which would be reflected in an increase in the detected body resistance $R_K$. However, such short-term malfunctions of the safety device 1 should not lead to the safety device 1 being triggered (generation of a warning signal and/or emergency signal S and/or other configured action), which can irritate the wearer and/or lead to the electrical system 10, or a part thereof, being disconnected from the power supply. However, false triggering of the safety device 1 is possible in this state of improper contacting of a skin electrode 3.

A person 8 wearing a safety device 1 according to the invention usually works in the region of an electrical system 10, often also a medium-voltage or high-voltage system. In the region of electrical systems 10, electrical fields can occur which can generate electrical potentials in the vicinity of the electrical system 10. A skin electrode 3 having no contact or poor contact with the skin of a person 8 in the region of such electrical fields detects an electrical potential generated by the electrical field. This can lead to a potential difference between the two skin electrodes 3 and subsequently to the detection of a measurement signal $S_K$, e.g., an electrical voltage, by the measuring unit 14. The electrical potentials in such electrical fields can become large enough that the evaluation unit 6 concludes that there is a dangerous body current $i_K$ and the safety device 1 is triggered. However, this is an undesired false triggering because there is no dangerous situation. This problem can also occur if both skin electrodes 3 do not contact the skin or only do so poorly. As is known, the electrical field decreases with the distance, so that sufficiently large, different electrical potentials caused by the electrical field can be applied to the two skin electrodes 3 for triggering the safety device 1. This problem does not occur if the skin electrodes 3 are properly contacted, because the entire body 8 is then in the electrical field and the body 8 is substantially at the same electrical potential.

In order to avoid such false triggering, provision is made for the triggering sensitivity $E_A$ of the safety device 1 to be changed depending on the detected body resistance $R_K$.

If the body resistance $R_K$ increases, for example because the contact between the skin electrode 3 and the skin deteriorates or the contact is completely lost, the triggering sensitivity $E_A$ is reduced, for example, so that any electrical fields that may occur in the vicinity of the person 8 cannot lead to a false triggering of the safety device 1, and thus subsequently cannot lead to an incorrect shutdown of the electrical system 10 or a part thereof.

As explained above, the poor contact can be indicated to the person 8 wearing the safety device 1.

Figure 4:
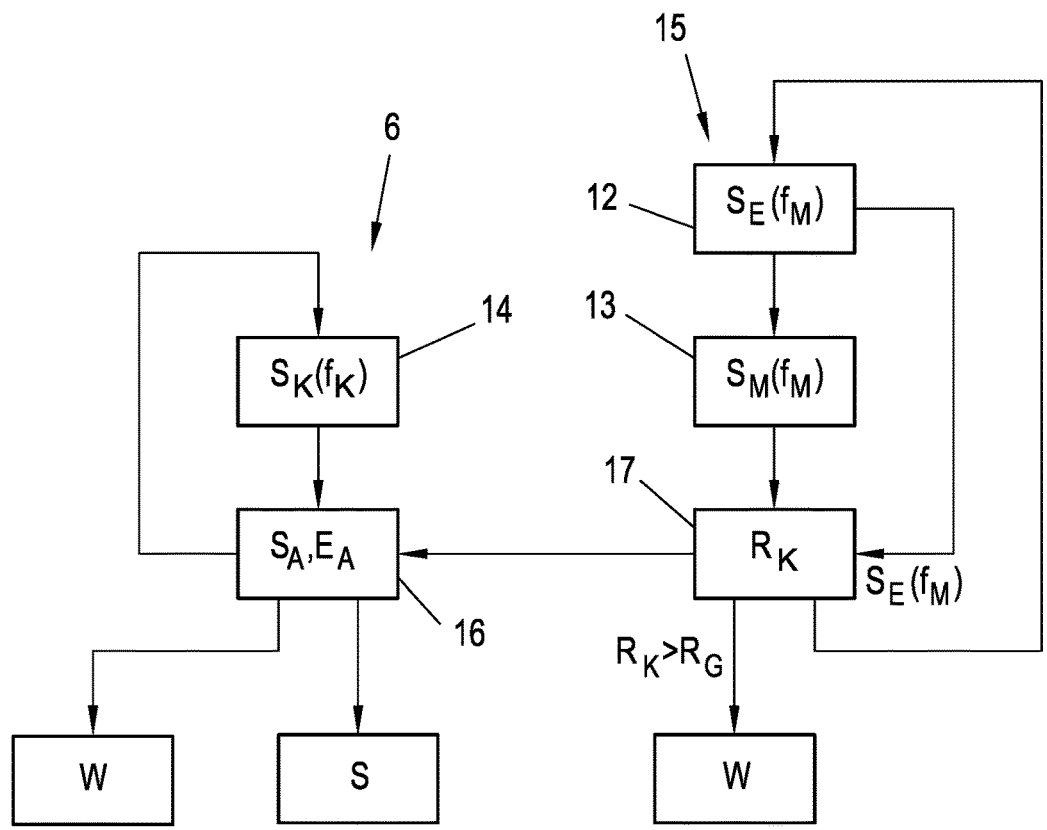
FIG. 4 shows the parallel determination of the body resistance and generation of an emergency signal and FIG. 5 shows a safety device without an item of clothing.

In this state, however, the safety device 1 may no longer be able to maintain the monitoring function of dangerous body currents $i_K$. It would therefore be the responsibility of the person 8 in this situation to respond to the poor contact warning and check the skin electrodes 3. In the safety device 1, the determination of the body resistance $R_K$ and the monitoring for dangerous body currents $i_K$ run simultaneously, as explained with reference to FIG. 4. As already mentioned above, a common evaluation unit 6 can be provided for this purpose, or separate hardware units can also be provided, for example an evaluation unit 6 and a separate resistance measuring device 15.

By feeding in an electrical feed signal $S_E(f_M)$, for example an electrical current (or else an electrical voltage), at a feed frequency $f_M$ via the skin electrodes 3 and detecting an electrical measurement signal $S_M(f_M)$, for example an electrical voltage or an electrical current, at this frequency $f_M$, a body resistance $R_K$ of the person 8 wearing the safety device 1 is determined. The feed can be provided via an energy source 12 (FIG. 3), and the measurement signal SM can be detected by a measuring unit 13 (FIG. 3). The body resistance $R_K$ is detected continuously (e.g., by an analog circuit or in discrete sampling steps) or regularly at specific predetermined times. Parallel to this, a further electrical measurement signal $S_K(f_K)$, for example an electrical voltage or an electrical current, is detected between the skin electrodes 3 in the specified measurement frequency range $f_K$. The detection is carried out by a measuring unit 14. The measuring unit for detecting the measurement signals SM, SK at the different frequencies $f_K$, $f_M$ can be the same, or separate measuring units can also be provided. An evaluation signal $S_A$ is determined from the measurement signal $S_K(f_K)$ in the measurement frequency range $f_K$. If the evaluation signal $S_A$ reaches the specified triggering sensitivity $E_A$ of the safety device 1, the safety device 1 is triggered, for example, a warning signal W and/or an emergency signal S is generated and output, and/or a further configured safety action is set. During operation of the safety device 1, the triggering sensitivity $E_A$ is changed depending on the detected body resistance $R_K$. If the body resistance $R_K$ increases, then the triggering sensitivity $E_A$ is increased, for example, and vice versa.

The dependency of the triggering sensitivity $E_A$ on the body resistance $R_K$ can be stored in the safety device 1, for example in a memory of the evaluation unit 6 or the measurement signal evaluation unit 16, in the form of, for example, a table, a function, a mathematical model, etc. This dependency can be empirically determined, for example, or can also be calculated or simulated based on physical relationships, but is assumed to be known.

For example, the triggering sensitivity $E_A$ could be divided into two ranges. If the body resistance $R_K$ is below 1 MΩ, the triggering sensitivity $E_A$ could be set to 2 volts (with an electrical voltage as the evaluation signal $S_A$). If an evaluation signal $S_A$ of more than 2 volts was detected between the skin electrodes 3, the safety device 1 would then be triggered, for example an emergency signal S would be output. If the evaluation signal $S_A$ remains below the triggering sensitivity $E_A$ of 2 volts, the safety device 1 does not trigger. At a detected body resistance $R_K$ of more than 1 MΩ, the triggering sensitivity $S_A$ is set to infinity, for example. In this way, the safety device 1 would never be triggered independently of the evaluation signal $S_A$. Irrespective of this, however, a warning signal W could be output after a specified period of time, for example after a few minutes, in order to inform the person 8 that protection is no longer available.

Of course, multi-stage or stepless characteristics are also conceivable in which the triggering sensitivity $E_A$ is gradually adapted depending on the body resistance $R_K$.

In this way, false triggering of the safety device 1 as a result of poor or non-existent contact between the skin electrodes 3 and the skin can at least be reduced.

Figure 5:
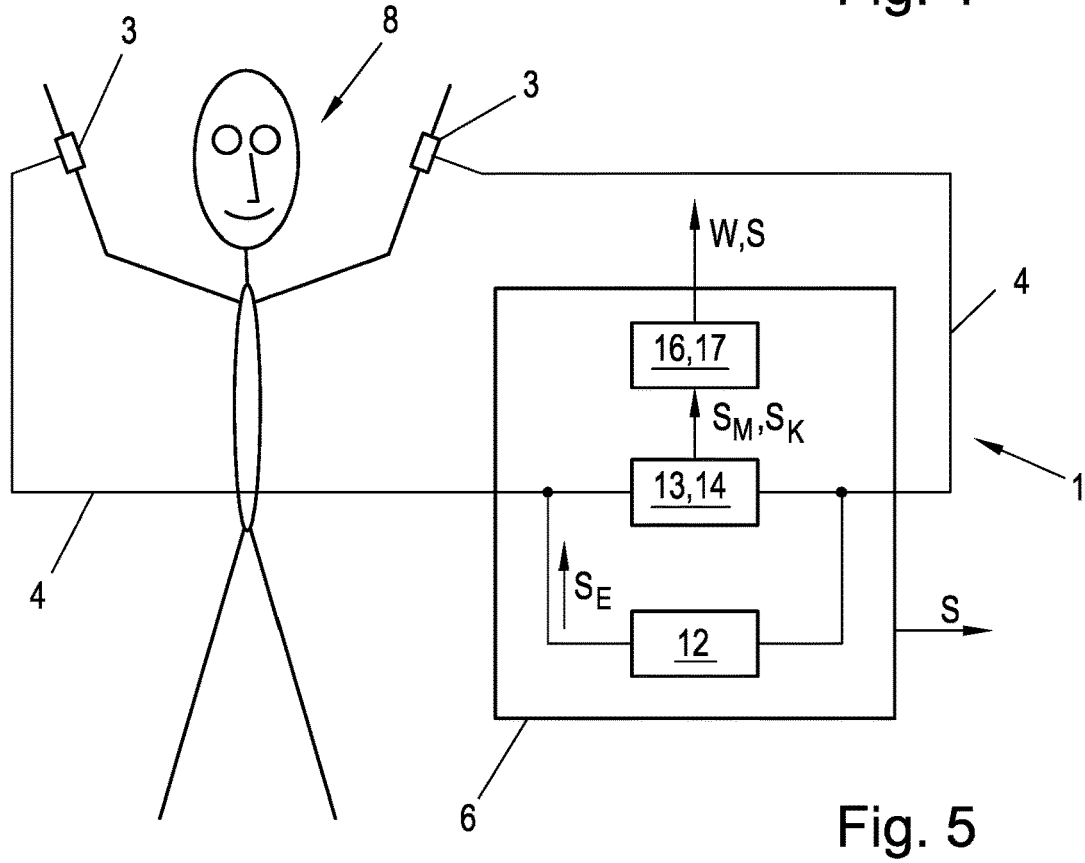

A possible implementation of the safety device 1 without an item of clothing 2 is shown in FIG. 5. A person 8 wears at least two skin electrodes 3, which are connected to an evaluation unit 6 via signal lines 4. An energy source 12 is provided in the evaluation unit 6 in order to feed in a feed signal $S_E(f_M)$ at an intended feed frequency $f_M$ via the skin electrodes 3. The measuring unit 13 detects, in a frequency-selective manner, a first measurement signal $S_K(f_K)$ in a specified measurement frequency range $f_K$ and a second measurement signal $S_M(f_M)$ at the feed frequency $f_M$ unequal to the measurement frequency range $f_K$. The first measurement signal SK is evaluated in a measurement signal evaluation unit 16, and an evaluation signal $S_A$ is determined, based on which an impermissible body current $i_K$ is inferred if a specified triggering sensitivity $E_A$ is reached. The body resistance $R_K$ is determined using the second measurement signal $S_M$ and the feed signal $S_E$, for example in a resistance evaluation unit 17, and the triggering sensitivity $E_A$ is set depending on the determined body resistance $R_K$. In this exemplary embodiment, the resistance evaluation unit 17 and measurement signal evaluation unit 16 are both integrated in one unit, for example as software on a suitable microprocessor-based computing unit.

The invention claimed is:

1. A safety device comprising
at least two skin electrodes, in which a first measuring device and a measurement signal evaluation unit are provided,
wherein the first measuring device is configured and arranged to detect a first electrical measurement signal in a measurement frequency range between the at least two skin electrodes;
wherein the measurement signal evaluation unit is configured and arranged to determine an evaluation signal from the detected first electrical measurement signal and trigger the safety device if the evaluation signal reaches a specified triggering sensitivity;
an electrical energy source configured and arranged to feed an electrical feed signal, having a specified feed frequency unequal to the measurement frequency range, via the at least two skin electrodes;
a second measuring device; and
a resistance evaluation unit;
wherein the second measuring device is configured and arranged to detect a second electrical measurement signal at the feed frequency, and the resistance evaluation unit is configured and arranged to determine a body resistance occurring between the at least two skin electrodes from the detected second electrical measurement signal and the electrical feed signal;
characterized in that the safety device is configured and arranged to change the triggering sensitivity depending on the determined body resistance.

2. The safety device according to claim 1, wherein the safety device is further configured and arranged to emit an acoustic, visual or palpable warning signal if the determined body resistance exceeds a specified limit resistance and/or a dangerous body current flowing through the body resistance is detected.

3. The safety device according to claim 1, wherein the safety device is further configured and arranged to emit an emergency signal if a dangerous body current flowing through the body resistance is detected.

4. A method for operating a safety device, the safety device comprising at least two skin electrodes, the method including the following steps:
detecting a first electrical measurement signal in a measurement frequency range between the at least two skin electrodes;
determining an evaluation signal from the detected first electrical measurement signal;
triggering the safety device if the evaluation signal reaches a specified triggering sensitivity of the safety device;
feeding an electrical feed signal having a specified feed frequency unequal to the measurement frequency range via the at least two skin electrodes;
detecting a second electrical measurement signal at the specified feed frequency;
determining a body resistance occurring between the at least two skin electrodes from the detected second electrical measurement signal and the electrical feed signal; and
changing the triggering sensitivity of the safety device depending on the determined body resistance.

5. The method according to claim 4, further including the step of outputting an acoustic, visual and/or palpable warning signal if the determined body resistance exceeds a specified limit resistance and/or a dangerous body current flowing through the body resistance is detected.

6. The method according to claim 5, further including the step of outputting an emergency signal by the safety device if a dangerous body current flowing through the body resistance is detected.

* * * * *